US012736586B2

(12) United States Patent
Mathew et al.

(10) Patent No.: US 12,736,586 B2
(45) Date of Patent: Sep. 15, 2026

(54) METHODS AND DEVICES FOR MULTI-STACK BATTERY MANAGEMENT FOR ENERGY STORAGE SYSTEMS

(71) Applicant: Nuvation Research Corporation, Sunnyvale, CA (US)

(72) Inventors: Manoj Mathew, Kitchener (CA); Nathanael Dimitro Wennyk, Waterloo (CA)

(73) Assignee: Nuvation Research Corporation

( * ) Notice: Subject to any disclaimer, the term of this patent is extended or adjusted under 35 U.S.C. 154(b) by 175 days.

(21) Appl. No.: 18/677,436

(22) Filed: May 29, 2024

(65) Prior Publication Data

US 2025/0370051 A1 Dec. 4, 2025

(51) Int. Cl.
*G01R 31/389* (2019.01)
*G01R 31/367* (2019.01)
*G01R 31/3842* (2019.01)

(52) U.S. Cl.
CPC ....... *G01R 31/3842* (2019.01); *G01R 31/367* (2019.01); *G01R 31/389* (2019.01)

(58) Field of Classification Search
CPC .................................................... G01R 31/396
See application file for complete search history.

(56) References Cited

U.S. PATENT DOCUMENTS 10,637,251 B2 * 4/2020 Helling ................. H02J 7/0068
10,664,562 B2 * 5/2020 Balasingam ....... G01R 31/3842
2020/0274203 A1 8/2020 Kirleis et al.
2022/0144132 A1 5/2022 Jin et al.
2022/0314835 A1 10/2022 Altaf et al.
2023/0236258 A1 7/2023 Worry et al.

OTHER PUBLICATIONS

International Search Report and Written Opinion dated Jul. 28, 2025 in PCT Application No. PCT/US2025/031279.

* cited by examiner

*Primary Examiner* — Tung X Nguyen
(74) *Attorney, Agent, or Firm* — SNELL & WILMER L.L.P.

(57) ABSTRACT

A multi-stack battery management device is disclosed herein. In various embodiments, the multi-stack battery management device comprises an energy storage system comprising one or more stacks including, wherein the one or more connected stacks comprises one or more connected stacks and one or more disconnected stacks, wherein the connected stacks are connected to a shared DC bus, a measurement module comprising a voltage measurement device and a current measurement device, the voltage measurement device configured to measure a measured voltage associated with one of the one or more stacks and the current measurement device configured to measure a measured current associated with one of the one or more stacks; a stack estimation system for receiving the measured voltage and the measured current from the measurement module and for generating an estimated stack open circuit voltage and an estimated stack resistance for one or more of the stacks; and a multi-stack management module for receiving the estimated stack open circuit voltage and the estimated stack resistance and for determining an output signal based on the estimated stack open circuit voltage and the estimated stack resistance, wherein the output signal is used for determining whether to connect the one or more disconnected stacks to the shared DC bus.

18 Claims, 5 Drawing Sheets

METHODS AND DEVICES FOR MULTI-STACK BATTERY MANAGEMENT FOR ENERGY STORAGE SYSTEMS

FIELD OF INVENTION

The present disclosure relates generally to energy storage systems ("ESS") comprising multiple battery cells, in particular management of cells sharing a common DC bus.

BACKGROUND

Energy storage systems ("ESS") are often composed of multiple battery stacks (or strings). Each battery stack may comprise one or more battery cells connected in series. The battery stacks may be connected in parallel. For example, multiple battery stacks may be needed to meet the energy requirements of various sites or functions. Where multiple stacks are used in a system, there can be differences in the resistance and the capacity between stacks. This may cause the voltages of individuals stack to vary at rest and during ESS operation. Connection of stacks at different voltages can generate large in-rush currents, which can be damaging to the battery.

The resistance of a battery stack is composed of an ohmic resistance term and a time-dependent resistance term that is associated with the polarization effects within the battery. Currently no approach exists that considers both the ohmic and polarization resistance when determining if a stack or multiple stacks can be connected to an already connected pack. In addition, traditional approaches do not account for variations in battery capacity between stacks. Without considering variation in resistance and capacity, ESS systems often need to bring stacks to very similar voltage levels before connection. This can lead to longer downtime of ESS systems and increased cost.

Therefore, systems, methods and devices that allow for more efficient management and control of multiple stacks are desirable.

SUMMARY

A multi-stack battery management device is disclosed herein. In various embodiments, the multi-stack battery management device may comprise an energy storage system comprising one or more stacks including, wherein the one or more connected stacks comprises one or more connected stacks and one or more disconnected stacks, wherein the connected stacks are connected to a shared DC bus. In various embodiments, the multi-stack battery management device may further comprise a measurement module comprising a voltage measurement device and a current measurement device, the voltage measurement device configured to measure a measured voltage associated with one of the one or more stacks and the current measurement device configured to measure a measured current associated with one of the one or more stacks. In various embodiments, the multi-stack battery management device may further comprise a stack estimation system for receiving the measured voltage and the measured current from the measurement module and for generating an estimated stack open circuit voltage and an estimated stack resistance for one or more of the stacks. In various embodiments, the multi-stack battery management device may further comprise a multi-stack management module for receiving the estimated stack open circuit voltage and the estimated stack resistance and for determining whether to connect the one or more disconnected stacks to the energy storage system based on the estimated stack open circuit voltage and the estimated stack resistance, and to provide an output signal to a controller, the output signal based on the determining whether to connect the one or more disconnected stacks, and the controller for connecting one or more disconnected stacks to the shared DC bus of the energy storage system based on the output signal.

A multi-stack battery management method is disclosed herein. In various embodiments, the multi-stack battery management method may comprise measuring, by a measurement module comprising a voltage measurement device and a current measurement device, a measured voltage and a measured current associated with a stack of an energy storage system. The energy storage system may comprise the one or more stacks. The one or more stacks may comprise one or more connected stacks and one or more disconnected stacks. The connected stacks may be connected to a shared DC bus. In various embodiments, the multi-stack battery management method may further comprise receiving, by a multi-stack estimation system, the measured voltage and the measured current from the measurement module. In various embodiments, the multi-stack battery management method may further comprise generating, by the multi-stack estimation system, an estimated stack open circuit voltage and an estimated stack resistance for one or more of the stacks. In various embodiments, the multi-stack battery management method may further comprise receiving, by a multi-stack management module, the estimated stack open circuit voltage and the estimated stack resistance. In various embodiments, the multi-stack battery management method may further comprise determining, by the multi-stack management module, whether to connect the one or more disconnected stacks to the energy storage system based on the estimated stack open circuit voltage and the estimated stack resistance. In various embodiments, the multi-stack battery management method may further comprise providing, by the multi-stack management module, an output signal to a controller. The output signal may be based on the determining whether to connect the one or more disconnected stacks. In various embodiments, the multi-stack battery management method may further comprise connecting, by the controller, one or more disconnected stacks to the shared DC bus of the energy storage system based on the output signal.

BRIEF DESCRIPTION OF THE DRAWING FIGURES

Additional aspects of the present disclosure will become evident upon reviewing the non-limiting embodiments described in the specification and the claims taken in conjunction with the accompanying figures, wherein like numerals designate like elements, and:

DETAILED DESCRIPTION

Figure 1A:
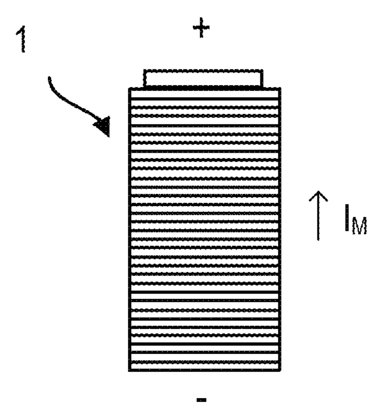
FIG. 1A is a diagram illustrating an example energy storage cell.

The following detailed description of various embodiments herein refers to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

Reference will now be made to the exemplary embodiments illustrated in the drawings, and specific language will be used herein to describe the same. It will nevertheless be understood that no limitation of the scope of the disclosure is thereby intended. Alterations and further modifications of the inventive features illustrated herein, and additional applications of the principles of the disclosure as illustrated herein, which would occur to one skilled in the relevant art and having possession of this disclosure, are to be considered within the scope of the disclosure.

In accordance with various example embodiments, in a battery pack or battery bank with several battery stacks that can be connected/disconnected to a common DC bus, at times it is desirable to know if one or more of the disconnected battery stacks can be connected to the DC bus that the other battery stacks are connected to. Otherwise, connecting disconnected battery stack(s) to a shared DC bus can result in in-rush currents that might damage the stack(s) being connected or the stack(s) that were already connected.

Disclosed herein are systems, devices and methods for predicting whether each of the disconnected stacks can be connected to a shared DC bus during battery operation, either separately or simultaneously. Further disclosed is a multi-stack connection management module that predicts the predicted connection current of each stack and compares each predicted connection current of each stack to a threshold current, and provides an output indicative of the safety of connecting each of the disconnected stacks. This determination can be made individually for each disconnected stack or groups of stacks, to determine which stacks can be connected.

In an example embodiment, a multi-stack connection management system that accounts for both stack resistance and capacity variations, will allow for connection of batteries that are at different state-of-health. As the ESS loses capacity over time, the ability to add new stacks to an aged pack will allow the ESS to continue to meet its energy requirements. Another advantage of the disclosed multi-stack connection management technique is the flexibility to connect batteries of different chemistries. Finally, the disclosed method can connect stacks automatically during operation. The operator does not need to worry about manually charging individual stacks for connection.

In accordance with various example embodiments, an energy storage system ("ESS") is a system that stores and releases electrical charge. The ESS may comprise electrochemical cells, such as lead-acid batteries, nickel-cadmium batteries, nickel-metal hydride batteries, lithium-ion batteries, lithium-ion polymer batteries, zinc-air batteries, and/or the like. Moreover, the ESS may comprise any suitable rechargeable energy storage system for which multi-string management is relevant.

Figure 1B:
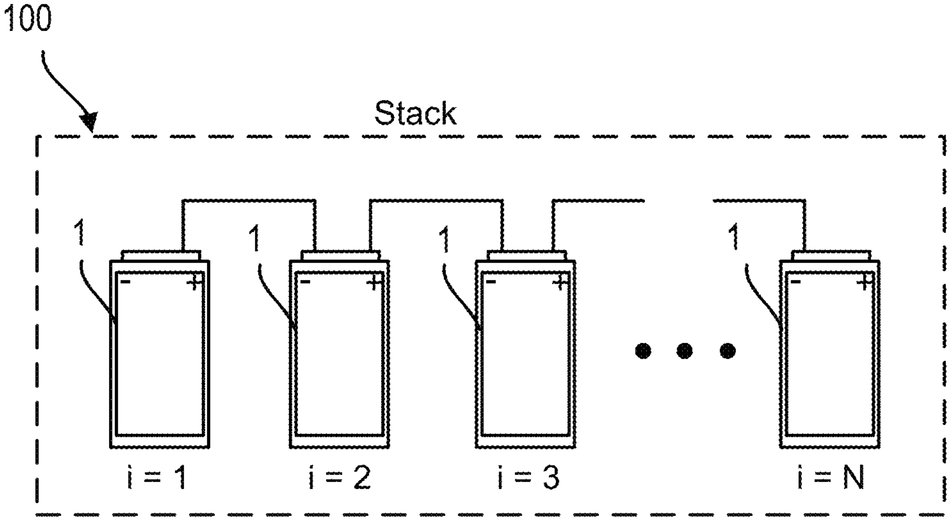
FIG. 1B is a diagram illustrating an example stack.

In the various example embodiments described herein, and with reference to FIGS. 1A and 1B, an ESS may comprise, in an example embodiment, a battery cell 1, or simply "cell" for short. In an example embodiment, the cell 1 comprises a single anode and cathode separated by electrolyte and is used to store and release electrical charge. Multiple anodes and cathodes may be joined together in parallel or series arrangements to produce cells that operate at higher voltage or current levels. The cell may be the smallest measurable unit of energy storage within an ESS. The current flowing through the cell 1 is denoted $I_m$, where a positive current flows out of the positive terminal. A typical cell can be physically arranged as a cylindrical cell, such as the 18650 and 21700 cylindrical lithium-ion format cells, button cells, prismatic cells, pouch cells, and/or the like. Moreover, a cell may comprise any chemistry and format suitable for rechargeable energy storage where multi-stack management is relevant. Generally, the cell 1 may be any rechargeable energy storage device with connection points for a single voltage measurement.

Moreover, an ESS may comprise, in an example embodiment a battery module, or simply "module" for short. A module may comprise two or more cells connected in series or parallel arrangements or both series and parallel arrangements and grouped together. A module may be the smallest measurable unit in the ESS, if the individual cells are integrated into the module in such a way that measurement of voltage from the individual cells is not convenient.

Moreover, an ESS may comprise, in an example embodiment, a battery stack 100, stack of cells, or simply "stack" for short. The stack 100, in an example embodiment, comprises multiple cells or modules electrically connected in series. Thus, in an example embodiment, a stack 100 may comprise N cells, and each cell, in the stack of cells, may be noted as cell n wherein n=1 to N. It will be understood that N may be any positive integer number. For N>1, the stack comprises a number of cells, N. A group of series connected cells may be called a stack, or stack of cells or string.

Figure 2:
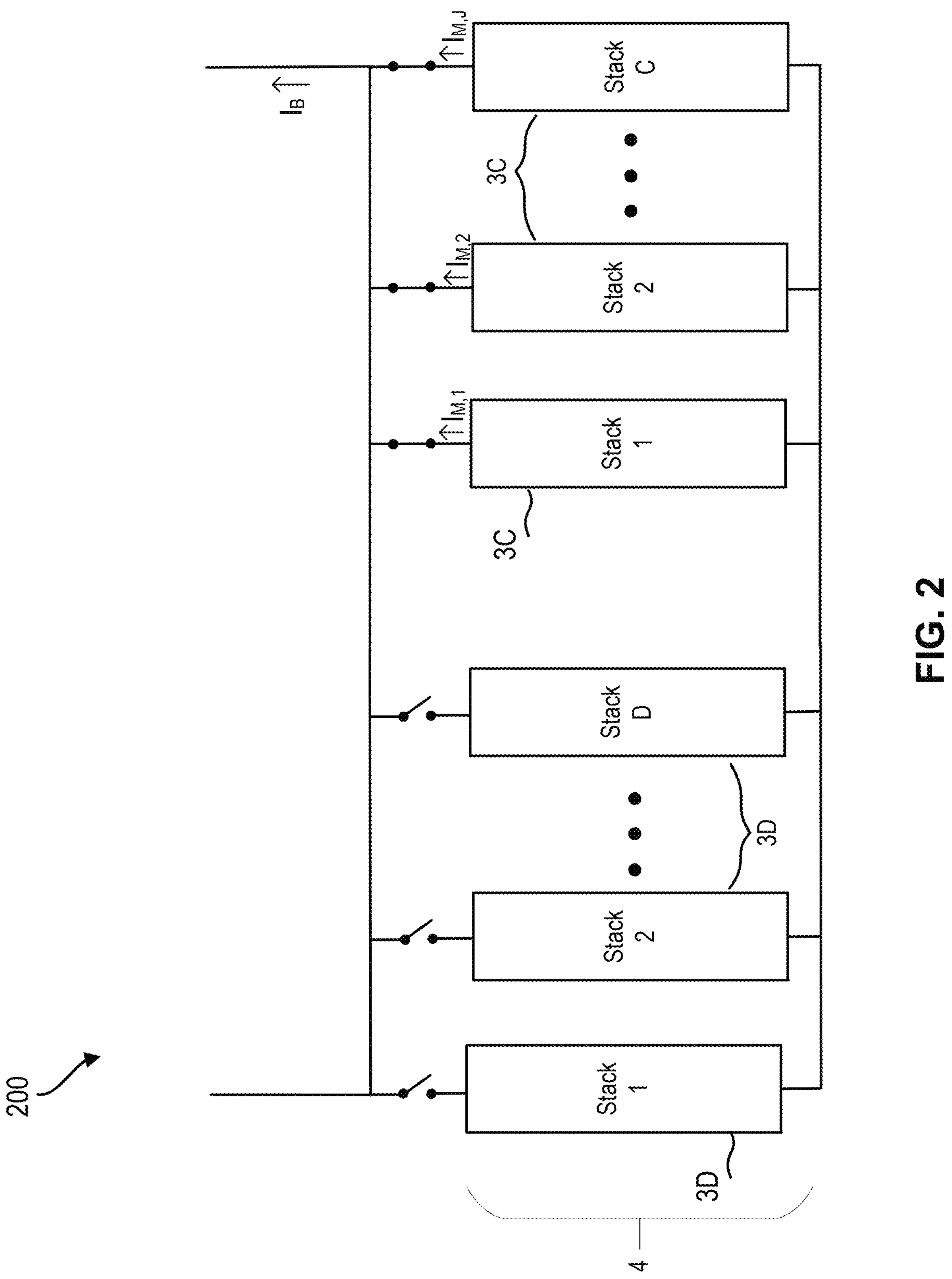
FIG. 2 is a block diagram illustrating a multi-stack system topology, with C connected stacks and D disconnected stacks, in accordance with various embodiments.

Moreover, an ESS may comprise, in an example embodiment, and with reference to FIG. 2, a multi-stack system 200 comprising a battery pack 4. In various embodiments, a battery pack 4, or simply "pack" for short. In various embodiments, the pack 4 may be referred to as a battery bank or "bank." The pack 4, in an example embodiment, comprises multiple stacks (e.g. stacks 3C and stacks 3D), electrically connected in parallel. Thus, in an example embodiment, a pack 4 may comprise J connected stacks at any particular time. In various embodiments, and as shown in FIG. 2, the pack 4 may comprise additional disconnected stacks 3D, which may be added at some point in time in parallel with stacks 3C. The current flowing through the pack 4 is denoted $I_B$, which is also electrically equivalent to the sum of the individual stack currents $I_{M,1 \ldots J}$. The number of stacks in pack 4 that are connected to a shared DC-bus, may change over time dynamically where one or more stack(s) can be connected or disconnected from the pack 4 using contactors, circuit breakers, solid-state switches, or any other suitable means of making or breaking current flow.

In an example embodiment, the pack 4 can comprise C connected stacks (c=1 . . . C), where the stacks are electrically connected to a shared DC bus. The pack 4 can further comprise D disconnected stacks (d=1 . . . D), where the stack is disconnected from the shared DC bus. Thus, in an example embodiment, the sum of the total connected stacks C and the total disconnected stacks D equals the total number of stacks in the energy storage system, denoted J.

In an example embodiment, the D disconnect stacks (d=1 . . . D), may first be connected to a pre-charge circuit (not shown), prior to connection to the shared DC bus, as described in further detail with reference to FIG. 3. For example, in various embodiments, the multi-stack system 200 may connect one or more disconnected stacks to a pre-charge circuit to prevent large in-rush currents from the power conversion system (PCS) capacitor, then once the stack has reached a suitable low current flow, the disconnected stack D may be connected to the shared DC bus.

In various embodiments, the multi-stack system 200 may be connected to a grid, generator or other items (not shown). In various embodiments, the multi-stack system 200 may be connected to an inverter, power conversion system (PCS) or other device.

Figure 3:
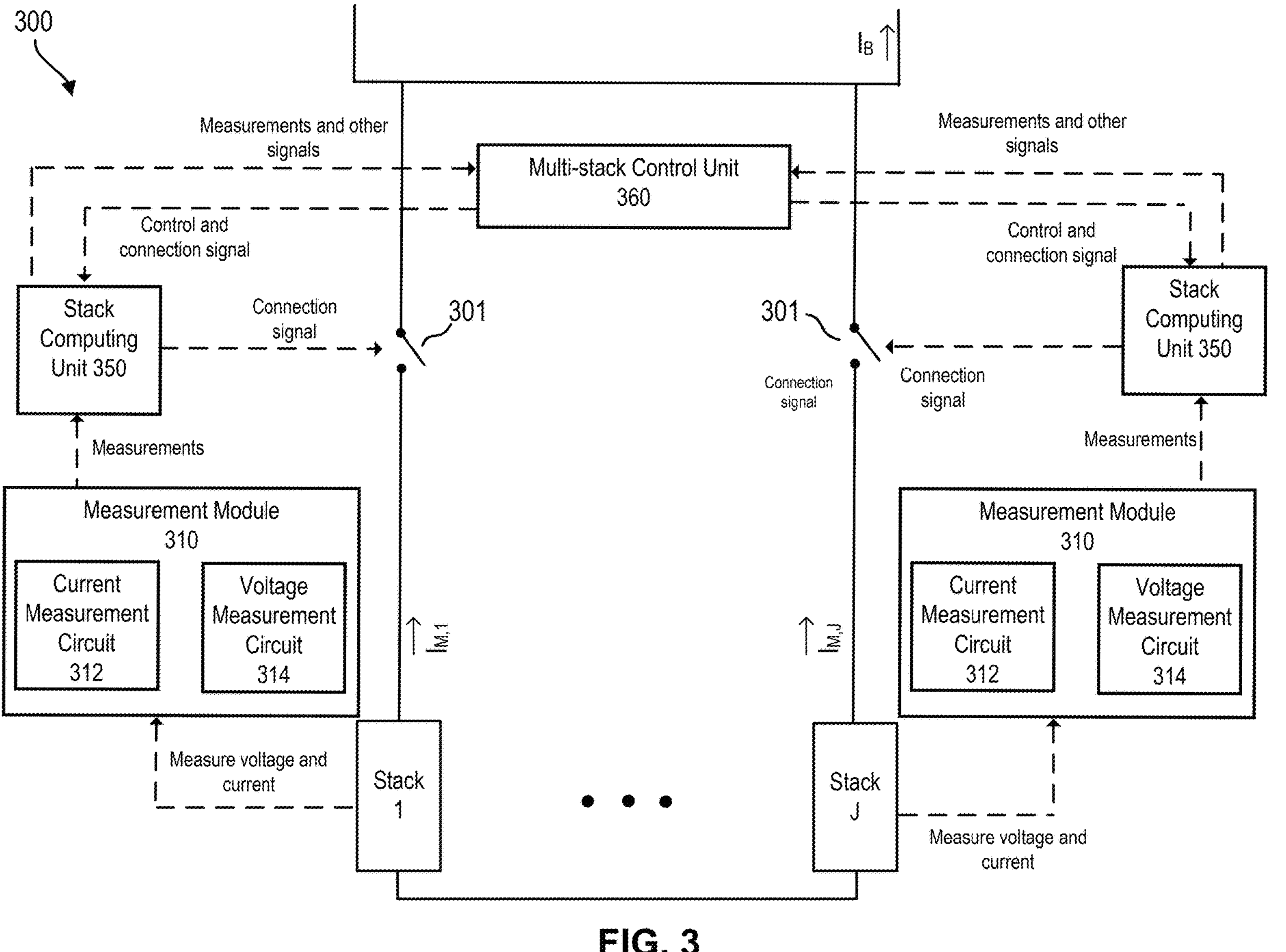
FIG. 3 is a diagram illustrating a multi-stack management system, in accordance with various embodiments.

With reference now to FIG. 3, a multi-stack management system 300 is shown in accordance with various embodiments. In various embodiments, the multi-stack management system 300 may be configured to measure the current and/or voltage of one or more stacks and control the connections to one or more stacks of an energy storage system. In various embodiments, the multi-stack management system 300 may be in communication, either directly or indirectly, with J stacks of an energy storage system. In various embodiments, each of the J stacks may each be connected to a measurement module 310. In various embodiments, a measurement module 310 may be connected to one or more stacks.

The measurement module 310 may comprise a current measurement circuit 312 and/or a voltage measurement circuit 314. In various embodiments, the current measurement circuit 312 and the voltage measurement circuit 314 may comprise sensors to measure the current and voltage of a stack, respectively, as described in greater detail with reference to FIG. 4. In various embodiments, the measurement module 310 may measure the current output from stack J. In various embodiments, the measurement module 310 may measure the voltage across stack J. In various embodiments, the measurement module 310 may measure the voltage across each individual stack J. It is noted that the measurement module may receive these measurements from sensors located remote from the multi-stack management system 300, e.g., located proximate the stacks.

In various embodiments each stack J may be connected to a shared DC bus by a connector 301. In various embodiments, the connector 301 may be a switch, a contactor or other suitable connection device. Moreover, the connector 301 may be any suitable device for connecting or disconnecting the stack(s) from the shared DC bus, or for switchingly controlling a current flow provided by a stack J to the shared DC bus.

In various embodiments, the multi-stack management system 300 may further comprise a multi-stack control unit 360 and a stack computing unit 350. In various embodiments, the stack computing unit 350 may be in connection with the measurement module 310 and configured to receive the measured voltage and/or measured current of a stack J. In various embodiments, stack computing unit 350 is configured to provide the measured voltage and measured current to the multi-stack control unit 360.

The multi-stack control unit 360 may be configured to provide a control and/or connection signal to the stack computing unit 350. The signal provided by the multi-stack control unit 360 may be based on the voltage and current measurements of one or more stacks, J as described in more detail with reference to FIG. 4. In various embodiments, the stack computing unit 350 may be indirectly or directly in communication with one or more of the stacks J. In various embodiments, the stack computing unit 350 may be connected to the connectors 301, and configured to control the current across the connectors 301. Stated another way, the stack computing unit 350 may be configured to control the opening and closing of connectors 301, to connect or disconnect a stack associated with the respective connector 301. In various embodiments, the stack computing unit 350 of multiple stacks J may enable the opening of multiple connectors 301 associated with the stacks at the same time. In this case, the multiple stacks J may be connected to a shared DC bus simultaneously. For example, the stack computing unit 350 may be in communication with each of the disconnected stacks D, as shown with reference to FIG. 2.

In various embodiments, the multi-stack control unit 360 is configured to manage the multiple stacks. In various embodiments, the multi-stack control unit 360 may determine a signal output, and the signal output may be used to determine whether to connect or disconnect one or more of the stacks J. In an example embodiment, the stack computing unit 350 may receive the signal output from the multi-stack control unit 360 and disconnect or connect one or more stacks J by causing the connectors 301 to switch open or closed, respectively.

With continued reference to FIG. 3 and reference to FIG. 4, in various embodiments, the multi-stack control unit 360 and/or the stack computing unit 350 may implement the stack estimation system 470, and/or the multi-stack management module 450, as shown and described with reference to FIG. 4. In various embodiments, the multi-stack control unit 360 may implement the stack estimation system 470 and/or the multi-stack management module 450. In various embodiments, the stack computing unit 350 may implement the stack estimation system 470.

In an example embodiment, the stack computing unit 350 may be a single computing unit. In an example embodiment, the stack computing unit 350 can be multiple computing units that share measurement data and output when to connect/disconnect an individual stack or group of stacks. Stated another way, stack computing unit 350 may be configured to cause connectors 301 to connect and/or disconnect individual stacks J to the shared DC bus, based on the output signal or other determinations of the multi-stack management module 450. As discussed, in various embodiments, the stack computing unit 350 may implement the stack estimation system 470, and provide signals to the connectors 301 based on determinations of the multi-stack management module 450 and/or the stack estimation system 470.

In an example embodiment, a stack J may be connected to a pre-charge circuit (not shown) prior to connecting the stack J. For example, the multi-stack management system

300 may determine an additional stack J should be connected, however it is unknown how much PCS related in-rush current can occur due to connection of the stack. One or more disconnected stacks (d=1 . . . D), as shown with reference to FIG. 2, may first be connected to a pre-charge circuit, to remove PCS related in-rush current, prior to connection to the shared DC bus.

Figure 4:
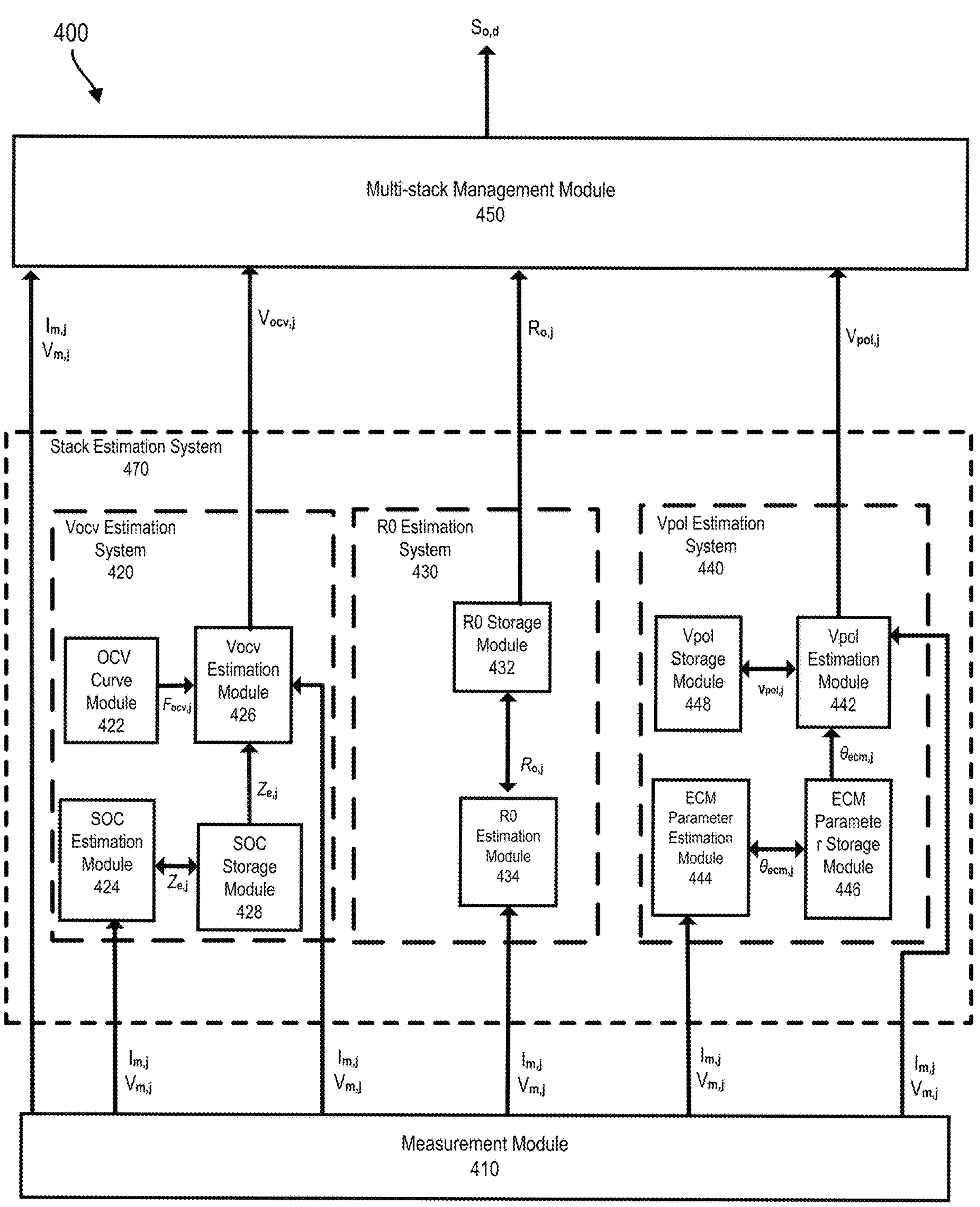
FIG. 4 is a block diagram illustrating an example multi-stack management system, in accordance with various embodiments.

With reference now to FIG. 4, a multi-stack management system 400 is shown in accordance with various embodiments. In various embodiments, a multi-stack management system 400 may comprise a measurement module 410, and a multi-stack management module 450 and a stack estimation system 470. In various embodiments, the stack estimation system 470 may comprise a Vocv Estimation System 420, a R0 Estimation System 430, and/or a Vpol Estimation System 440. In various embodiments, the multi-stack management system 400 may be in communication with one or more stacks, as described with reference to FIG. 3. For example, the measurement module 410 of the multi-stack management system 400 may be in communication to the one or more stacks J and configured to measure the current measurement and/or voltage measurement for the stacks J. In various embodiments, and as described in detail in reference to FIG. 3, the multi-stack management module 450 and/or the stack estimation system 470 may be implemented on the stack computing unit 350 and/or the multi-stack control unit 360. Further, the multi-stack management module 450 of the multi-stack management system 400 may be configured to provide an output signal, wherein the output signal includes whether to connect or disconnect one or more stacks J. In various embodiments, the multi-stack management system 400 may determine whether to connect an additional stack or group of stacks, to the already connected stack or stacks, based on the determinations of the system.

Measurement Module 410

With continued reference to FIG. 4, in an example embodiment, the measurement module 410 may be configured to measure the current and or voltage for each stack. The measurement module 410 may be a single module configured to measure the current and/or voltage of each stack, or may comprise distributed measurement modules. For example, the distributed measurement module embodiment may comprise a separate measurement module for each stack. The present disclosure is not limited in this regard. The measurement module 410 may be similar in design and function to that of measurement module 310 as described with reference to FIG. 3.

In various embodiments, the measurement module 410 may comprise a current measurement circuit and a voltage measurement circuit. In various embodiments, the measurement module 410 may comprise a current measurement module. In various embodiments, the current measurement module may comprise a current sensor, such as a hall effect sensor, a current shunt, or the like. In various embodiments, the current measurement module may comprise a current sensor located convenient to measuring the current into or out of a stack in an ESS. In various embodiments, the current measurement module may be connected to each stack. In various embodiments, the cells in each of the one or more stacks may be connected in series, therefore a measurement of the current into or out of the stack is equivalent to the current into or out of each cell. In an example embodiment, a stack may have only one cell. In various embodiments, the current measurement module is configured to sample current at a time step k. For example, the current measurement module, may sample the current of each of the one or more stacks in 1 second intervals, though any sampling period can be used. In an example embodiment, the current measurement module can be any suitable current measurement device that is configured to measure a current (into or out of the stack) and to generate a measured current, $I_{m,j}$, representing a measured current for each of the stacks.

In various embodiments, the measurement module 410 may comprise a voltage measurement circuit. In various embodiments, the measurement module 410 may comprise a voltage measurement module, which may comprise a voltage sensor, such as a capacitive voltage sensor, a resistive type voltage sensor, or the like. In various embodiments, the measurement module 410 may comprise a voltage sensor which may be located convenient to measuring the voltage across each stack of an ESS. In various embodiments, the voltage measurement module of the measurement module 410 can be any suitable voltage measurement device that is configured to measure a voltage and to generate a measured voltage, $V_{m,j}$, representing the measured voltage across each stack. In various embodiments, the voltage measurement module of the measurement module 410 may be any suitable voltage measurement device that is configured to measure a voltage and to generate a measured voltage, $V_{m,j}$, representing the voltage across the DC bus. In various embodiments, the measurement module 410 may sample voltage measurements at a time step, k. In various embodiments, the measurement module 410 may sample voltage measurements where k is 1 second, though any suitable time step can be used. In various embodiments, the measurement module 410 may determine or measure a stack voltage, wherein the stack voltage is the measured voltage of a stack of one or more cells connected in series. In various embodiments, measurement module 410 may determine or measure a plurality of stack voltages, wherein the plurality of stack voltages is the measured voltage of each of one or more stacks.

In various embodiments, the multi-stack management system 400 may comprise a stack estimation system 470. The stack estimation system 470 may comprise the Vocv estimation system 420, the R0 estimation system 430, and/or the Vpol estimation system 440. The stack estimation system 470 may receive the current and voltage measurement of one or more stacks and provide the current measurement and voltage measurement to the Vocv estimation system 420, the R0 estimation system 430, and/or the Vpol estimation system 440, as described in further detail herein. In various embodiments, the stack estimation system 470 may be implemented on the stack computing unit 350, as described with reference to FIG. 3. In various embodiments, the stack estimation system 470 may be implemented on the stack computing unit 350, as described with reference to FIG. 3. In various embodiments, the stack estimation system 470 may be implemented on a controller based in the cloud or other distributed computer network. In various embodiments, the stack estimation system 470 may be implemented on the stack level where in a separate stack estimation system 470 is used for each of the multiple stacks of the system. In various embodiments, the stack estimation system 470 may be implemented on the cell level wherein the stack estimation system 470 may estimate based on the individual cells.

In various embodiments, the measurement module 410 may provide the current measurement $I_M$ and/or Vm of each of the one or more stacks to the Vocv estimation system 420, the R0 estimation system 430, and/or the Vpol estimation system 440. In various embodiments, the measurement module 410 may provide the stack current or any other measured current for one or more stacks to the multi-stack management module 450. In various embodiment, the stack estimation system 470 may provide an estimate of the ohmic resistance for each stack of the one or more stacks ($R_{o,j}$), the stack open circuit voltage for one or more stacks ($V_{ocv,j}$), and/or the stack polarization voltage for one or more stacks ($V_{pol,j}$) to the multi-stack management module 450. In various embodiments, when the stack is disconnected, the value of stack ohmic resistance ($R_{o,j}$) and the stack open circuit voltage ($V_{ocv,j}$), does not change, but the polarization voltage can still change.

Vocv Estimation System 420

In various embodiments, the Vocv estimation system 420, also referred to herein as the open circuit voltage estimation system 420, may comprise one or more modules. In various embodiments, the Vocv estimation system 420 may comprise an open circuit voltage estimation module 426, a SOC storage module 428, a SOC estimation module 424 and/or an OCV curve module 422. In various embodiments, the Vocv estimation system 420 may receive a measured current $I_{m,j}$ for each of the one or more stacks. For example, the Vocv estimation system 420 may receive one or more stack currents from the measurement module 410. In various embodiments, the Vocv estimation system 420 may receive both a measured current $I_{m,j}$ for one or more stacks and a measured voltage $V_{m,j}$. For example, in various embodiments, the Vocv estimation system 420 may receive a stack current and a stack voltage from the measurement module 410. In various embodiments, the Vocv estimation system 420 may be configured to predict the open circuit voltage $V_{ocv,j}$ for each of the one or more stacks. Thus, the $V_{ocv}$ estimation system 420, in an example embodiment is configured to provide a predicted $V_{ocv,j}$ for each stack based on measured stack currents and voltages for each stack.

OCV Curve Module 422

In an example embodiment, the Vocv estimation system 420 may comprise a OCV curve module 422, also referred to herein as the open circuit voltage curve module 422. In various embodiments, the OCV curve module 422 may provide an OCV curve, Focv(SOC) for one or more stacks. In various embodiments, the OCV curve module 422 may provide the OCV curve, Focv(SOC), to the Vocv estimation module 426 for one or more stacks. In various embodiments, the OCV curve may be a function of the state-of-charge. For example, the OCV curve may represent the open-circuit voltage as a function of state-of-charge for a stack. In various embodiments, the OCV curve may be provided by the manufacturer of the cells or stacks of cells and provided to the system. In various embodiments, the OCV curve may be calculated by testing of the energy storage device itself or testing similar energy storage devices. In various embodiments, the OCV curve may be a function or may be a look-up table-based function. Thus, in one example embodiment, the OCV curve is determined once and does not change over time. However, in other example embodiments, the nominal OCV curve may be adjusted over time to account for changes in temperature or other factors. In an example embodiment, two different OCV curves may be used for each stack, one for charge and the other for discharge. In an example embodiment, the OCV curve for each stack can be determined by taking a cell OCV curve and multiplying by the number of cells in the stack.

SOC Estimation Module 424

In various embodiments, the SOC estimation module 424 may estimate the state of charge ("SOC") for each of the one or more stacks, denoted $Z_{e,j,k}$. The SOC estimation module 424 may receive inputs of measured current $I_{m,j}$ each stack. In various embodiments, the SOC estimation module 424 may receive a SOC estimate from the SOC storage module 428 and provide an updated SOC estimate to the SOC storage module 428. In various embodiments, the SOC estimation module 424 may estimate the SOC, $Z_{e,j,k}$, of each of the one or more stacks based on accumulating the current over time as shown in the following equation, where $Cap_{nom,j}$ is the capacity of the stack, and Δt is an accumulation time step:

$$Z_{e,j,k} = Z_{e,j,k-1} - \frac{(I_{m,j,k})\Delta t}{Cap_{nom,j}}$$

The current at time step k, and the SOC estimate from the previous time step, k−1, is used to determine the SOC, denoted $Z_{e,j,k}$, at time step k. In various embodiments, the SOC estimation module 424 may estimate the SOC of one or more stacks, $Z_{e,j,k}$, by accumulating charge over time, as shown in the following equation, where $Cap_{nom,j}$ is the capacity of the stack, and Δt is an accumulation time step and $Q_{m,k}$ is the additional charge at time step k:

$$Z_{e,j,k} = Z_{e,j,k-1} - \frac{Q_{m,k}}{Cap_{nom,j}}$$

In various embodiments, the SOC estimation module 424 may estimate the SOC of one or more cells in a stack. For example, the SOC estimation module 424 may receive the measured current of one or more cells and the measured voltage of one or more cells in the stack and may estimate the SOC of the one or more cells based on a recursive Bayesian filter. In various embodiments, any suitable type of estimation algorithm for estimating cell level SOC may be used.

In an example embodiment, the SOC estimation module 424 is configured to provide the SOC estimate Ze,j,k to the SOC storage module 428 based on the current measurements from measurement module 410. In an example embodiment, when the stack is disconnected, the SOC estimates will not change since there is zero current flowing through the disconnected stack.

SOC Storage Module 428

In various embodiments, the SOC storage module 428 may store the most up-to-date cell and/or stack SOC estimates for each stack of the one or more stacks. For example, the SOC storage module 428 may send and receive SOC estimates for each time step, k. In various embodiments, the SOC storage module 428 may receive one or more SOC estimates from the SOC estimation module 424. In various embodiments, the SOC storage module 428 may provide one or more SOC estimates to the Vocv estimation module 426. In various embodiments, the SOC storage module 428 may be updated by the SOC estimation module 424 at each sampling time k. For example, the SOC estimation module 424 may receive an updated SOC estimate corresponding to each time sample. In various embodiments, the SOC storage module 428 may provide the Vocv estimation module 426 and/or the SOC estimation module 424 with the SOC estimate. In various embodiments, the SOC estimation module 424 may use the previous SOC estimate from the SOC storage module 428 to determine the updated SOC estimate. In various embodiments, the SOC estimation module 424 may then send the updated SOC estimate to the SOC storage module 428 and the SOC storage module 428 may store the updated SOC estimate. In various embodiments, the SOC storage module 428 may receive an updated SOC estimate from the SOC estimation module 424.

Vocv Estimation Module 426

In an example embodiment, the Vocv estimation module 426 may estimate the open circuit voltage, $V_{ocv,j}$ for one or more stacks, based on the SOC from SOC storage module 428 and the stack OCV curve from OCV curve module 422. In various embodiments, the Vocv estimation module 426 may also be referred to herein as the open circuit voltage estimation module 426. In various embodiments, the Vocv estimation module 426 may receive the stack OCV curve $F_{ocv}$(SOC), also referred to as the open circuit voltage curve, from the OCV curve module 422. In various embodiments, the Vocv estimation module 426 may receive the stack SOC, $Z_{e,j}$, from the SOC storage module 428. In various embodiments, the Vocv estimation module 426 may determine the Vocv for each stack of the one or more stacks in the energy storage system based on the respective stack OCV curve, $F_{ocv,j}$, and/or the respective stack SOC $Z_{e,j}$.

In one example embodiment, the Vocv estimation module 426 may receive an open circuit voltage curve, wherein the OCV curve is based on a stack level look-up table and the stack $V_{ocv,j}$ is obtained by looking up the corresponding voltage to the stack SOC $Z_{e,j}$ as follows, where $F_{ocv}(\cdot)$ is the stack level look-up table:

$$V_{ocv,j} = F_{ocv}(Z_{e,j})$$

In one example embodiment, the Vocv estimation module 426 may receive an open circuit voltage curve, where the OCV curve is a cell level look-up table and the stack $V_{ocv,j}$ is obtained by looking up the corresponding voltage to the cell SOC $Z_{e,i,j}$ and summing all the individual OCV values for each cell in the stack, as follows:

$$V_{ocv,j} = \sum_{i=1}^{N} F_{ocv,i,j}(Z_{e,i,j})$$

In another example embodiment, the Vocv estimation module 426 may determine the open circuit voltage based on the measured voltage for one or more stacks, the estimated ohmic resistance $R_{o,j}$ for one or more stacks and the measured current $I_{m,j}$ for one or more stacks, as shown in the following equation: $V_{ocv,j}=V_{m,j}-R_{o,j}I_{m,j}$. In an example embodiment, the estimated stack resistance $R_{o,j}$ may be provided from R0 estimation system 430 to the multi-stack management module 450.

In various embodiments, the Vocv estimation module 426 may provide the stack open circuit voltage, $V_{ocv,j}$, to the multi-stack management module 450.

R0 Estimation System 430 and R0 Estimation Module 434

In an example embodiment, the R0 estimation system 430 may comprise a R0 storage module 432 and a R0 estimation module 434. In various embodiments, R0 estimation system 430 may be referred to herein as the resistance estimation system 430. Further, in various embodiments the R0 storage module 432 may be referred to herein as the resistance storage module 432 and the R0 estimation module 434 may be referred to herein as the resistance estimation module 434. In various embodiments, R0 estimation system 430 may estimate the stack ohmic resistance, or simply stack resistance, for one or more stacks. In various embodiments, the R0 estimation system 430 may generate an estimated stack resistance based on the measured current and measured voltage of each stack of the one or more stacks. In various embodiments, the R0 estimation system 430 may receive the measured voltage and the measured current from the measurement module 410. The R0 estimation system 430 may determine the stack resistance and provide the stack resistance for each stack to the multi-stack management module 450. In various embodiments, the R0 estimation module 434 of the R0 estimation system 430 may be configured to generate the stack resistance and update the stack resistance.

In various embodiments, the R0 estimation module 434 of the R0 estimation system 430 may generate a new or updated estimate of stack resistance based on a measured current and measured voltage for one or more stacks and the contemporaneous estimate of the stack ohmic resistance for each stack of the one or more stacks. In an example embodiment, the R0 estimation module 434 of R0 estimation system 430 may generate an updated estimate of stack resistance when the change in stack current between subsequent samples is greater than a configurable current threshold. In an example embodiment, the R0 estimation module 434 of the R0 estimation system 430 may generate an updated estimate of stack resistance for each stack when the change in stack voltage between subsequent samples is greater than a configurable voltage threshold. For example, the r0 estimation module 434 may update the estimate of stack resistance when the difference in subsequent samples of the measured voltage of a stack and measured current or a stack is above a current and/or voltage threshold, i.e. when there is sufficient excitation.

In an example embodiment, the R0 estimation module 434 of R0 estimation system 430 may generate an instantaneous estimate of stack resistance by taking the difference between subsequent samples of current and subsequent samples of measured voltage and dividing the change in voltage by the change in current, as in the following equation:

$$R_{inst,j,k} = \text{abs}\left(\frac{V_{m,j,k} - V_{m,j,k-1}}{I_{m,j,k} - I_{m,j,k-1}}\right)$$

In various embodiments, the R0 estimation module 434 may estimate the contemporaneous stack resistance based on the previous stack resistance from the R0 storage module 432, and filtering the instantaneous stack resistance, $R_{inst,j,k}$, using a first order low pass filter or any suitable filter. In various embodiments, the contemporaneous stack resistance value may be stored in the R0 storage module 432. For example, R0 estimation module 434 may estimate the stack ohmic resistance $R_{o,j,k}$ by filtering the instantaneous stack resistance based on the following equation:

$$R_{o,j,k} = (1-\lambda_c)R_{0,j,k-1} + \lambda_c R_{inst,j,h}$$

where $\lambda_c$ is the constant smoothing factor used in filtering resistance estimates.

In various embodiment, when the stack is disconnected, there won't be any current flowing through the stack and therefore no estimation will occur. The stack ohmic resistance value for disconnected stacks will remain constant.

R0 Storage Module 432

In various embodiments, R0 storage module 432 is configured to receive and store one or more stack level ohmic resistance estimates from R0 estimation module 434. For example, the R0 storage module 432 may send and receive R0 estimates for each time step, k. In various embodiments, the stack level ohmic resistance estimate is the filtered resistance estimate determined above. In various embodiments, the R0 storage module 432 may be updated by the R0 estimation module 434 at each sampling time k. In various embodiments, the R0 storage module 432 provides the R0 estimation module 434 with the most recent estimate of stack resistance for one or more stacks in the energy storage system. In various embodiments, the R0 storage module 432 may also be referred to as the resistance storage module 432.

Thus, in various embodiments, the R0 estimation system 430 may generate an estimated stack resistance based on the measured current and measured voltage for each stack of the one or more stacks, and provide the estimated stack resistance to the multi-stack management module 450.

Vpol Estimation System 440

In various embodiments, the Vpol Estimation System 440 may also be referred to herein as the polarization voltage estimation system 440. In various embodiments, the Vpol Estimation System 440 may comprise a Vpol Estimation Module 442, an ECM Parameter Estimation Module 444, an ECM Parameter Storage Module 446 and a Vpol Storage Module 448. In various embodiments, the Vpol Estimation System 440 may receive the measured current and measured voltage for each stack of the one or more stacks. In various embodiments, the Vpol Estimation System 440 may be configured to receive the measured current and measured voltage from the measurement module 410. In various embodiments, the Vpol Estimation System 440 is configured to determine the stack polarization voltage of each stack of the one or more stacks. In various embodiments, the Vpol Estimation System 440 is configured to determine the stack polarization voltage based on the measured current and measured voltage for each stack of the one or more stacks. In various embodiments, the Vpol Estimation System 440 may provide the stack polarization voltage to the multi-stack management module 450.

ECM Parameter Estimation Module 444

In various embodiments, the ECM parameter estimation module 444 may be used to estimate the ECM parameters, θecm,j, of each stack of the one or more stacks. In various embodiments, the ECM parameter estimation module 444 may receive the measured current and measured voltage for each stack of the one or more stacks and the contemporaneous estimate of the ECM parameters for each stack of the one or more stacks. In various embodiments, and as used herein, ECM means equivalent circuit model. In an example embodiment, the ECM parameters, θecm,j, will consist of two parameters $R_{th,j}$ and $C_{th,j}$. In an example embodiment, the ECM parameters represent a resistor-capacitor pair in an equivalent circuit model. In an example embodiment, the ECM parameters are used to describe the time-dependent voltage drops that occur within a battery due to polarization effects. In an example embodiment, a single equivalent circuit model may be used to model the polarization effects of the entire stack. In an example embodiment, individual cell level equivalent circuit models can be used to predict the polarization effects of the entire stack. In an example embodiment, the ECM parameter estimation module 444 may generate a ECM parameter estimate using a recursive Bayesian filter, such as an extended Kalman filter. In other example embodiment, the ECM parameter estimation module 444 may generate a ECM parameter using any suitable online estimation approach. In various embodiments, the ECM parameter estimation module 444 may provide an updated estimated ECM parameters to the ECM parameter storage module 446. In an example embodiment, the ECM parameter estimation module 444 may generate a ECM parameter estimate and update the ECM parameter storage module 446 with this updated value.

ECM Parameter Storage Module 446

In various embodiments, the ECM parameter storage module 446 may store equivalent circuit model parameters for the stack or cells. In various embodiments, the ECM parameter storage module 446 may be updated by the ECM parameter estimation module 444 at each sampling time k. In various embodiments, the ECM parameter storage module 446 may provide the Vpol estimation module 442 and the ECM parameter estimation module 444 with the most recent estimate of the ECM parameters for each stack of the one or more stacks in the energy storage system.

Vpol Estimation Module 442

In various embodiments, the Vpol estimation module 442 may estimate the polarization voltage, also referred to as the Vpol estimate. In various embodiments, the Vpol estimation module 442 may also be referred to herein as the polarization voltage estimation module 442. In various embodiments, the Vpol estimation module 442 may receive the measured current and measured voltage for one or more stacks. In various embodiments, the Vpol estimation module 442 may also receive the contemporaneous estimate of the ECM parameters for one or more stacks, $\theta_{ecm,j}$, from the ECM parameter storage module 446. In various embodiments, the Vpol estimation module 442 may determine the Vpol estimate based on the measured current and measured voltage for one or more stacks and the contemporaneous estimate of the ECM parameters for one or more stacks, $\theta_{ecm,j}$. In various embodiments, the Vpol estimation module 442 may determine the polarization voltage for the stacks based on an equivalent circuit model (ECM). For example, the equivalent circuit model has one or more resistor-capacitor pairs and the Vpol estimation module 442 may determine the polarization voltage for the stacks based ECM.

In one example embodiment, the Vpol estimation module 442 may generate the voltage polarization estimate by using the previously calculated polarization voltage, the ECM parameters and the measured current. For example, if the stack is modeled using a single equivalent circuit model with one RC pair, the voltage polarization estimate may be based on the following equation, $$V_{pol,j,k} = \exp\left[-\frac{\Delta t}{\tau_{1,k}}\right]V_{pol,j,k-1} + \left(1 - \exp\left[-\frac{\Delta t}{\tau_{1,k}}\right]\right)R_{th,j}I_{m,j,k-1}$$

Where $\tau_{1,j}=R_{th,j}*C_{th,j}$, where Δt=the change in time between sampling step k and k−1, and where $R_{th,j}$ and $C_{th,j}$ represent a resistor-capacitor pair within the stack equivalent circuit model. In this example, the polarization voltage for each stack at each time step is based on the polarization voltage at the previous time step and the measured current. In various embodiments, the polarization estimate for the stack may be generated by determining the polarization estimate of individual cells and summing these values together.

Vpol Storage Module 448

In various embodiments, the Vpol Storage Module 448 may send and/or receive the voltage polarization estimate, Vpol to/from the Vpol Estimation Module 442. In various embodiments, the Vpol Storage Module 448 may update the voltage polarization estimate based on an updated voltage polarization estimate.

Multi-Stack Management Module 450

In various embodiments, the multi-stack management module 450 may be configured to determine whether to connect additional stacks to the energy storage system. In various embodiments, the multi-stack management module 450 may be configured to predict the response of connecting an additional stack or group of stacks to the energy storage system. In various embodiments, there may be a singular multi-stack management module 450 for each pack comprising multiple stacks. In various embodiments, the multi-stack management module 450 may be implemented or based in a BMS, EMS or in the cloud. In various embodiments, the multi-stack management module 450 may be on a control unit, such as multi-stack control unit 360 as described with reference to FIG. 3.

In various embodiments, the multi-stack management module 450 may receive inputs of ohmic resistance for each stack of the one or more stacks ($R_{o,j}$), the stack open circuit voltage for one or more stacks ($V_{ocv,j}$), the stack polarization voltage for one or more stacks ($V_{pol,j}$), the stack currents for one or more stacks ($I_{m,j}$) and the stack voltages for one or more stacks ($V_{m,j}$).

In various embodiments, the terminal voltage of the stack may be calculated by subtracting the stack ohmic resistance drop ($I_{mj}$*$R_{o,j}$) and the stack polarization resistance drop ($V_{pol,j}$) from the stack open-circuit voltage ($V_{ocv,j}$) as shown in the equation below:

$$V_{m,j} = V_{ocv,j} - I_{m,j} * R_{o,j} - V_{pol,j}$$

In various embodiments, the total current, IT, may be expressed as the sum of each individual current flowing through each of the stacks as shown in the equation below:

$$I_T = \sum_{j=0}^{J} I_{m,j}$$

In an example embodiment, the multi-stack management module 450 may calculate the predicted connection current for each of one or more stacks such that voltages for one or more stacks is equal to each other. For example, the multi-stack management module 450 may calculate the predicted connection current for each of one or more stacks such that voltages $V_{m,1}=V_{m,2}= \ldots =V_{m,j}$. In various embodiments, the predicted connection current may be the current that will flow through each of the stacks when a new stack or stacks are connected to the shared DC bus.

In various embodiments, the multi-stack management module 450 may calculate the current for each of the one or more stack by solving a system of linear equations. In various embodiments, the system of linear equations may be developed using the three equations shown above. For example, for a four stack energy storage system, with one disconnected stack and three connected stacks, the equations will be: $I_T=I_{m,1}+I_{m,2}+I_{m,3}+I_{m,4}$ $$V_{ocv,2} - V_{pol,2} - V_{ocv,1} + V_{pol,1} = -R_{o,1} * I_{m,1} + R_{o,2} * I_{m,2}$$

$$V_{ocv,3} - V_{pol,3} - V_{ocv,2} + V_{pol,2} = -R_{o,2} * I_{m,2} + R_{o,3} * I_{m,3}$$

$$V_{ocv,4} - V_{pol,4} - V_{ocv,3} + V_{pol,3} = -R_{o,3} * I_{m,3} + R_{o,4} * I_{m,4}$$

In various embodiments, the current for each of the stacks may be calculated by solving the system of linear equations by writing the system of equation in matrix form AX=B, where X is a vector of current values. The current values can be solved using any suitable linear algebra technique:

$$X = A^{-1}B$$

In various embodiments, the system of linear equations may be generated by considering the voltages, currents and resistances for all the connected stacks and the single disconnected stack. This will determine whether that single disconnected stack can be connected safely. In various embodiments, the system of linear equations may be generated by considering the voltages, currents and resistances for all the connected stacks and the multiple disconnected stack. This will determine whether the multiple stacks can be safely connected simultaneously.

In various embodiments, the multi-stack management module 450 may determine the maximum predictor current based on the calculated predicted connection currents for each of the one or more stacks. In various embodiments, the multi-stack management module 450 may determine whether or not to connect an additional stack or multiple additional stacks, based on if the maximum predicted connection current is greater than a configurable threshold. For example, the multi-stack management module 450 may determine whether to connect an additional stack based on the following equation, where $S_d$ is a signal output, and $I_{over}$ is the configurable current threshold:

$$S_d = \max([I_1 \quad I_2 \quad \ldots \quad I_c \quad I_d]) < I_{over}$$

Where $I_{1 \ldots c}$ is the current for the connected stacks and $I_d$ is the predicted connection current that will flow through the disconnected stack when it is connected to the shared DC bus. In various embodiments, the maximum current flow may have a hysteresis to it that allows a surge current for some amount of time that is above the maximum steady state current. For example, when a disconnected stack is connected to the shared DC bus, the system may account for a surge current for a period of time.

In various embodiments, the signal output, Sd, may be used to determine whether to connect or disconnect a stack within the energy storage system. In various embodiments, the signal output may provide a signal indicating whether the system may safely connect a stack to the shared DC bus of the energy storage system. In various embodiments, the system may determine whether to connect an additional stack to the shared DC bus based on the signal output. For example, a signal output may indicates that a stack can connect safely, however the system may further determine whether to connect an additional stack based on additional criteria. In various embodiments, the signal output may be an indication of whether it is safe to connect or unsafe to connect a stack. Further, the determination of whether to connect an additional stack or stacks may be based on the output signal and additional criteria, such as the state of health of the additional stack, the voltage of the additional stack, whether the additional stack is in service lockout or any suitable additional criteria.

In various embodiments, the output signal, Sd, may be provided to (or determined by software implemented on) the stack computing unit 350 or other suitable hardware configured to receive the output signal and control connection of the stacks. For example, multi-stack control unit 360, as shown with reference to FIG. 3 may comprise the some or all of the software modules of the multi-stack management system 400. The multi-stack control unit 360 may execute the processing of the measured values and determine the output signal. The multi-stack control unit 360 may provide the output signal, Sd, to the stack computing unit 350, as shown in reference to FIG. 3. In various embodiments, the multi-stack control unit 360 may determine whether to connect an additional stack based on the output signal and provide a signal to stack computing unit 350 to control whether to connect or disconnect a stack. Further, the multi-stack control unit 360 may determine which of the disconnected stacks to connect to the shared DC bus and provide this determination to the stack computing unit 350. In various embodiments, the multi-stack control unit 360 may determine whether to connect or disconnect a stack and provide a control signal to the stack computing unit 350 or directly control the connector 301. In various embodiments, and as described with reference to FIG. 3, the stack computing unit 350 may receive the output signal from the multi-stack control unit 360 and determine to connect or disconnect one or more connectors 301. In various embodiments, the stack computing unit 350 as shown in FIG. 3, may receive the output signal from the multi-stack management module 450 and control the connectors 301 to one or more stacks to connect or disconnect one or more stacks. For example, the multi-stack management module 450 may be configured to generate the output signal, Sd, and the stack computing unit 350 may receive the output signal and may connect a previously disconnected stack to the plurality of stacks of the energy storage system. In various embodiments, the multi-stack management module 450 may be in communication with a connector wherein the connector is a switch to control the current flow through one or more stacks. Thus, the output Sd of the multi-stack management module 450 may be control the connecting of a disconnected stack to the shared DC bus. In various embodiments, the multi-stack control unit 360 may further determine if a disconnected stack is unsuitable to connect and may lock out this disconnected stack. For example, the multi-stack control unit 360 may determine that a disconnected stack is unsafe and direct the system to not connect the identified disconnected stack in the future.

Moreover, the multi-stack management system 300 may comprise a controller. The controller may be configured to receive the output signal from the multi-stack management module and to connect one or more of the disconnected stacks to the shared DC bus of the energy storage system based on the outputs signal. In an example embodiment, the controller is the multi-stack control unit 360. Moreover, the controller can be any suitable system configured to control whether connectors 301 (e.g., switches) connect a disconnected stack to the shared DC bus.

Figure 5:
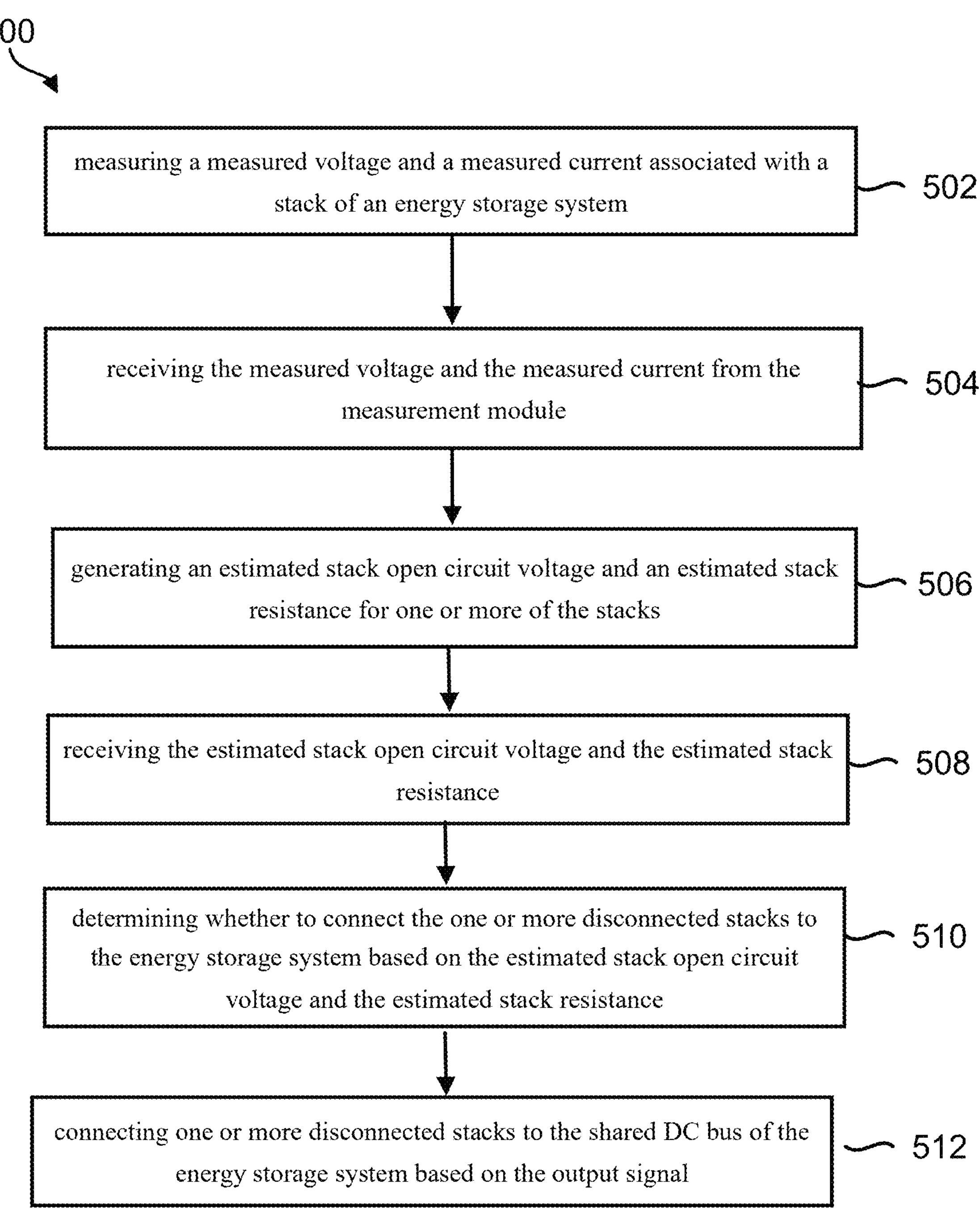
FIG. 5 illustrates a method of multi-stack management, in accordance with various embodiments.

With reference to FIG. 5, a multi-stack battery management method 500 is disclosed herein. In various embodiments, the multi-stack battery management method 500 may comprise measuring a measured voltage and a measured current associated with a stack of an energy storage system (Step 502). The energy storage system may comprise the one or more stacks. The one or more stacks may comprise one or more connected stacks and one or more disconnected stacks. The connected stacks may be connected to a shared DC bus. The measuring may be performed by a voltage sensor and current sensor, respectively.

In various embodiments, the multi-stack battery management method may further comprise receiving the measured voltage and the measured current from the measurement module (Step 504). In various embodiments, the multi-stack battery management method may further comprise generating an estimated stack open circuit voltage and an estimated stack resistance for one or more of the stacks (Step 506). The estimated stack open circuit voltage and an estimated stack resistance may be based on the measured voltage and measured current.

In various embodiments, the open circuit voltage estimation module may determine the stack open circuit voltage based on a stack open circuit voltage curve and the state-of-charge of each of the one or more of the stacks. In various embodiments, the resistance estimation module may determine the stack resistance based on the measured current of the one or more stacks, the measured voltage of the one or more stacks and the previous stack resistance estimate.

In various embodiments, the multi-stack battery management method may further comprise receiving the estimated stack open circuit voltage and the estimated stack resistance (Step 508). In various embodiments, the multi-stack battery management method may further comprise determining whether to connect the one or more disconnected stacks to the energy storage system based on the estimated stack open circuit voltage and the estimated stack resistance (Step 510). In an example embodiment, the determination may be made based on a predicted connection current, where the predicted connection current is compared to a maximum current threshold to determine if it is safe to connect. In various embodiments, the output signal may be based on the determining whether to connect the one or more disconnected stacks. In various embodiments, the multi-stack battery management method may further comprise connecting one or more disconnected stacks to the shared DC bus of the energy storage system based on the output signal (Step 512).

In various embodiments, the modules discussed herein can be implemented as and may include one or more processors and/or one or more tangible, non-transitory memories (e.g., memory) and be capable of implementing logic. Each processor can be a general-purpose processor, a digital signal processor ("DSP"), an application specific integrated circuit ("ASIC"), a field programmable gate array ("FPGA"), or other programmable logic device, discrete gate or transistor logic, discrete hardware components, or any combination thereof. The controller can comprise a processor configured to implement various logical operations in response to execution of instructions, for example, instructions stored on a non-transitory, tangible, computer-readable medium configured to communicate with the modules discussed.

System program instructions and/or controller instructions can be loaded onto a non-transitory, tangible computer-readable medium of the modules having instructions stored thereon that, in response to execution by a processor of the modules, cause the modules to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

Benefits, other advantages, and solutions to problems have been described herein regarding specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B, and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc. indicate that the embodiment described may include a particular feature, structure, or characteristic, but every embodiment may not necessarily include the feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It should be understood, however, that the detailed description and specific examples, while indicating exemplary embodiments of the present disclosure, are given for purposes of illustration only and not of limitation. Many changes and modifications within the scope of the instant disclosure may be made without departing from the spirit thereof, and the disclosure includes all such modifications. The corresponding structures, materials, acts, and equivalents of all elements in the claims below are intended to include any structure, material, or acts for performing the functions in combination with other claimed elements as specifically claimed. The scope of the disclosure should be determined by the appended claims and their legal equivalents, rather than by the examples given above. For example, the operations recited in any method claims may be executed in any order and are not limited to the order presented in the claims. Moreover, no element is essential to the practice of the disclosure unless specifically described herein as "critical" or "essential."

What is claimed:

1. A multi-stack battery management device, comprising:

an energy storage system comprising one or more stacks, wherein the one or more stacks comprise one or more connected stacks and one or more disconnected stacks, wherein the connected stacks are connected to a shared DC bus;

a measurement module comprising a voltage measurement device and a current measurement device, the voltage measurement device configured to measure a measured voltage associated with one of the one or more stacks and the current measurement device configured to measure a measured current associated with one of the one or more stacks;

a stack estimation system for receiving the measured voltage and the measured current from the measurement module and for generating an estimated stack open circuit voltage and an estimated stack resistance for one or more of the stacks;

the stack estimation system further comprising an open circuit voltage estimation system, the open circuit voltage estimation system configured to:

receive the measured current of one or more of the stacks and the measured voltage of the one or more of the stacks from the measurement module; and determine the estimated stack open circuit voltage for one or more of the stacks based on the measured current of the one or more of the stacks and the measured voltage of the one or more of the stacks; and the stack estimation system further comprising a resistance estimation system, the resistance estimation system configured to:

receive the measured current of the one or more of the stacks and the measured voltage of one or more of the stacks from the measurement module; and determine the estimated stack resistance for one or more of the stacks based on the measured voltage associated with the one or more of the stacks and the measured current associated with the one or more of the stacks; and a multi-stack management module for receiving the estimated stack open circuit voltage and the estimated stack resistance and for determining an output signal based on the estimated stack open circuit voltage and the estimated stack resistance, wherein the output signal is used to determine whether to connect the one or more disconnected stacks to the shared DC bus.

2. The multi-stack battery management device of claim 1, wherein the multi-stack battery management device further comprises a controller, the controller configured to receive the output signal from the multi-stack management module and connect one or more of the disconnected stacks to the shared DC bus of the energy storage system based on the output signal.

3. The multi-stack battery management device of claim 1, wherein the multi-stack battery management device further comprises a switch, the switch configured to connect one or more of the disconnected stacks to the shared DC bus of the energy storage system based on the output signal.

4. The multi-stack battery management device of claim 1, wherein the resistance estimation system further comprises:

a resistance estimation module configured to determine the estimated stack resistance for one or more of the stacks based on a plurality of the measured currents and the measured voltages of the one or more of the stacks;

wherein the estimated stack resistance is estimated when a voltage difference in subsequent samples of the measured voltage is greater than a configurable voltage threshold and when a current difference in subsequent samples of the measured current is greater than a configurable current threshold; and a resistance storage module for storing a contemporaneous stack resistance estimate for the one or more of the stacks, wherein the resistance estimation module uses a previous stack resistance estimate to update the contemporaneous stack resistance estimate.

5. The multi-stack battery management device of claim 4, wherein the open circuit voltage estimation system further comprises an open circuit voltage estimation module, the open circuit voltage estimation module configured to determine the stack open circuit voltage based on a stack open circuit voltage curve and a state-of-charge of each of the one or more of the stacks.

6. The multi-stack battery management device of claim 1, wherein the open circuit voltage estimation system further comprises a state-of-charge estimation module, the state-of-charge estimation module configured to determine a state-of-charge of each of the one or more of the stacks based on the measured current of each of the one or more of the stacks.

7. The multi-stack battery management device of claim 1, wherein the multi-stack management module is configured determine whether to connect one or more of the disconnected stacks to the shared DC bus based on the estimated stack open circuit voltage, an estimated stack polarization voltage, and the estimated stack resistance for each of the connected stacks.

8. The multi-stack battery management device of claim 1, wherein the voltage measurement device configured to measure the measured voltage associated with one or more of the connected stacks and the current measurement device configured to measure the measured current of one or more of the connected stacks.

9. The multi-stack battery management device of claim 1, wherein the voltage measurement device is configured to measure the measured voltage associated with one or more of the disconnected stacks.

10. A multi-stack battery management device, comprising:

an energy storage system comprising one or more stacks, wherein the one or more stacks comprise one or more connected stacks and one or more disconnected stacks, wherein the connected stacks are connected to a shared DC bus;

a measurement module comprising a voltage measurement device and a current measurement device, the voltage measurement device configured to measure a measured voltage associated with one of the one or more stacks and the current measurement device configured to measure a measured current associated with one of the one or more stacks;

a stack estimation system for receiving the measured voltage and the measured current from the measurement module and for generating an estimated stack open circuit voltage and an estimated stack resistance for one or more of the stacks; and a multi-stack management module for receiving the estimated stack open circuit voltage and the estimated stack resistance and for determining an output signal based on the estimated stack open circuit voltage and the estimated stack resistance, wherein the output signal is used to determine whether to connect the one or more disconnected stacks to the shared DC bus;

wherein the stack estimation system further comprises:

a polarization voltage estimation system, the polarization voltage estimation system configured to:

receive the measured current of one or more of the stacks and the measured voltage of the one or more stacks from the measurement module; and determine an estimated stack polarization voltage for the one or more stacks based on the measured voltage of one or more of the stacks and the measured current of one or more of the stacks; and wherein the multi-stack management module is configured to receive the estimated stack polarization voltage for the one or more of the stacks and to determine whether to connect one or more of the disconnected stacks to the shared DC bus based on the estimated stack open circuit voltage, the estimated stack resistance and the estimated stack polarization voltage.

11. The multi-stack battery management device of claim 10, wherein the polarization voltage estimation system further comprises a polarization voltage estimation module, the polarization voltage estimation module configured to determine the estimated stack polarization voltage for one or more of the stacks based on an equivalent circuit model.

12. The multi-stack battery management device of claim 11, wherein the polarization voltage estimation system further comprises an equivalent circuit model parameter estimation module, and the polarization voltage estimation system is configured to update an equivalent circuit model parameter using the equivalent circuit model parameter estimation module based on the measured voltage and the measured current of the one or more of the stacks.

13. The multi-stack battery management device of claim 12, wherein the multi-stack management module is configured to determine whether to connect one or more of the disconnected stacks to the shared DC bus by calculating a predicted connection current, wherein the predicted connection current is estimated based on the measured voltages for each of the one or more of the stacks are equal upon connection.

14. A multi-stack battery management method, comprising:

measuring, by a measurement module comprising a voltage measurement device and a current measurement device, a measured voltage and a measured current associated with a stack of an energy storage system;

wherein the energy storage system comprises one or more stacks;

wherein the one or more stacks comprises one or more connected stacks and one or more disconnected stacks; and wherein the connected stacks are connected to a shared DC bus;

receiving, by a multi-stack estimation system, the measured voltage and the measured current from the measurement module;

generating, by the multi-stack estimation system, an estimated stack open circuit voltage and an estimated stack resistance for one or more of the stacks;

receiving, by an open circuit voltage estimation system, the measured current of one or more of the stacks and the measured voltage of the one or more of the stacks from the measurement module;

determining, by the open circuit voltage estimation system, the estimated stack open circuit voltage for one or more of the stacks based on the measured current of the one or more of the stacks and the measured voltage of the one or more of the stacks;

receiving, by a resistance estimation system, the measured current of the one or more of the stacks and the measured voltage of one or more of the stacks from the measurement module;

determining, by the resistance estimation system, the estimated stack resistance for one or more of the stacks based on the measured voltage associated with the one or more of the stacks and the measured current associated with the one or more of the stacks;

receiving, by a multi-stack management module, the estimated stack open circuit voltage and the estimated stack resistance;

determining, by the multi-stack management module, an output signal based on the estimated stack open circuit voltage and the estimated stack resistance; and controlling connection of the one or more disconnected stacks to the shared DC bus of the energy storage system based on the output signal.

15. The multi-stack battery management method of claim 14, further comprising:

receiving, by a controller, the output signal; and connecting, by the controller, one or more of the disconnected stacks to the shared DC bus based on the output signal.

16. The multi-stack battery management method of claim 14, further comprising:

receiving, by a switch, the output signal; and connecting, by the switch, one or more of the disconnected stacks to the shared DC bus based on the output signal.

17. A multi-stack battery management method, comprising:

measuring, by a measurement module comprising a voltage measurement device and a current measurement device, a measured voltage and a measured current associated with a stack of an energy storage system;

wherein the energy storage system comprises one or more stacks;

wherein the one or more stacks comprises one or more connected stacks and one or more disconnected stacks; and wherein the connected stacks are connected to a shared DC bus;

receiving, by a multi-stack estimation system, the measured voltage and the measured current from the measurement module;

generating, by the multi-stack estimation system, an estimated stack open circuit voltage and an estimated stack resistance for one or more of the stacks;

receiving, by a multi-stack management module, the estimated stack open circuit voltage and the estimated stack resistance;

determining, by the multi-stack management module, an output signal based on the estimated stack open circuit voltage and the estimated stack resistance; and controlling connection of the one or more disconnected stacks to the shared DC bus of the energy storage system based on the output signal;

receiving, by a polarization voltage estimation system, the measured current of one or more of the stacks and the measured voltage of the one or more stacks from the measurement module;

determining, by the polarization voltage estimation system, an estimated stack polarization voltage for the one or more stacks based on the measured voltage of one or more of the stacks and the measured current of one or more of the stacks;

receiving, by the multi-stack management module, the estimated stack polarization voltage for the one or more of the stacks; and determining, by the multi-stack management module, whether to connect one or more of the disconnected stacks to the shared DC bus based on the estimated stack open circuit voltage, the estimated stack resistance and the estimated stack polarization voltage.

18. A multi-stack battery management method, comprising:

measuring, by a measurement module comprising a voltage measurement device and a current measurement device, a measured voltage and a measured current associated with a stack of an energy storage system;

wherein the energy storage system comprises one or more stacks;

wherein the one or more stacks comprises one or more connected stacks and one or more disconnected stacks; and wherein the connected stacks are connected to a shared DC bus;

receiving, by a multi-stack estimation system, the measured voltage and the measured current from the measurement module;

generating, by the multi-stack estimation system, an estimated stack open circuit voltage and an estimated stack resistance for one or more of the stacks;

receiving, by a multi-stack management module, the estimated stack open circuit voltage and the estimated stack resistance;

determining, by the multi-stack management module, an output signal based on the estimated stack open circuit voltage and the estimated stack resistance;

controlling connection of the one or more disconnected stacks to the shared DC bus of the energy storage system based on the output signal;

receiving, by a switch, the output signal; and connecting, by the switch, one or more of the disconnected stacks to the shared DC bus based on the output signal;

determining, by a resistance estimation module, the estimated stack resistance for one or more of the stacks based on a plurality of the measured currents and the measured voltages of the one or more of the stacks;

storing, by a resistance storage module, a contemporaneous stack resistance estimate for the one or more of the stacks; and updating, wherein the resistance estimation module uses a previous stack resistance estimate to update the contemporaneous stack resistance estimate;

wherein the estimated stack resistance is determined when a voltage difference in subsequent samples of the measured voltage of the stack is greater than a configurable voltage threshold and when a current difference in subsequent samples of the measured current of the stack is greater than a configurable current threshold.

* * * * *